United States Patent
Chang et al.

(10) Patent No.: US 9,159,916 B2
(45) Date of Patent: Oct. 13, 2015

(54) RESISTIVE RANDOM ACCESS MEMORY, CONTROLLING METHOD AND MANUFACTURING METHOD THEREFOR

(71) Applicant: INDUSTRIAL TECHNOLOGY RESEARCH INSTITUTE, Hsinchu (TW)

(72) Inventors: Ting-Chang Chang, Kaohsiung (TW);
Min-Chen Chen, Kaohsiung (TW);
Yong-En Syu, Tainan (TW);
Kuan-Chang Chang, Kaohsiung (TW);
Fu-Yen Jian, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 245 days.

(21) Appl. No.: 13/690,250

(22) Filed: Nov. 30, 2012

(65) Prior Publication Data

US 2014/0063903 A1 Mar. 6, 2014

(30) Foreign Application Priority Data

Sep. 4, 2012 (TW) .............................. 101132176 A (51) Int. Cl.
*G11C 11/00* (2006.01)
*H01L 45/00* (2006.01)
*G11C 11/21* (2006.01)
*G11C 13/00* (2006.01)

(52) U.S. Cl.
CPC .............. *H01L 45/145* (2013.01); *G11C 11/21* (2013.01); *G11C 13/0007* (2013.01); *G11C 13/0069* (2013.01); *H01L 45/085* (2013.01); *H01L 45/1233* (2013.01); *H01L 45/1266* (2013.01); *H01L 45/16* (2013.01); *G11C 2013/0083* (2013.01); *G11C 2213/15* (2013.01); *G11C 2213/56* (2013.01)

(58) Field of Classification Search
USPC ............................................ 365/148
See application file for complete search history.

(56) References Cited

U.S. PATENT DOCUMENTS

| 7,745,820 | B2 | 6/2010 | Berger et al. | |
|---|---|---|---|---|
| 8,035,095 | B2 * | 10/2011 | Lee et al. | 257/4 |
| 2009/0230378 | A1 | 9/2009 | Ryoo et al. | |
| 2010/0072042 | A1 | 3/2010 | Bertin et al. | |
| 2010/0117051 | A1 | 5/2010 | Tian et al. | |
| 2011/0180775 | A1 * | 7/2011 | Lin et al. | 257/4 |
| 2011/0183489 | A1 | 7/2011 | Ghenciu et al. | |
| 2012/0091420 | A1 * | 4/2012 | Kusai et al. | 257/4 |
| 2014/0014892 | A1 * | 1/2014 | Chiang et al. | 257/2 |

FOREIGN PATENT DOCUMENTS

| EP | 2 206 755 A1 | 7/2010 |
|---|---|---|
| TW | 310475 | 7/1997 |
| TW | 200945643 A1 | 11/2009 |
| TW | 201214673 A1 | 4/2012 |

* cited by examiner

*Primary Examiner* — Hoai V Ho
*Assistant Examiner* — Pablo Huerta
(74) *Attorney, Agent, or Firm* — Birch, Stewart, Kolasch & Birch, LLP (57) ABSTRACT

A resistive random access memory (RRAM), a controlling method for the RRAM, and a manufacturing method therefor are provided. The RRAM includes a first electrode layer; a resistance switching layer disposed on the first electrode layer; a diffusion metal layer disposed on the resistance switching layer; and a second electrode layer disposed on the diffusion metal layer, wherein at least one extension electrode is disposed in the resistance switching layer.

16 Claims, 8 Drawing Sheets

RESISTIVE RANDOM ACCESS MEMORY, CONTROLLING METHOD AND MANUFACTURING METHOD THEREFOR

CROSS-REFERENCE TO RELATED APPLICATION

This application is based on, and claims the priority benefit of Taiwan Application serial No. 101132176, filed on Sep. 4, 2012, the disclosure of which is hereby incorporated by reference herein in its entirety.

TECHNICAL FIELD

The disclosure relates to a resistive random access memory (RRAM), a controlling method and a manufacturing method therefor.

BACKGROUND

Memories are generally classified into volatile memories and non-volatile memories, and RRAM is one of the non-volatile memories which can be driven by electric current or voltage and can switch between the high impedance state and the low impedance state so as to store data. In the structure of RRAM, it is composed of a stacked layer of metal-insulator-metal, and the insulator may have reversible switching characteristics. During operations, a pulse voltage is applied to the RRAM to switch its resistance states to perform "data writing" or "data erasing", and then a small bias is used for capturing current values to determine the impedance state in order to read data.

Figure 1:
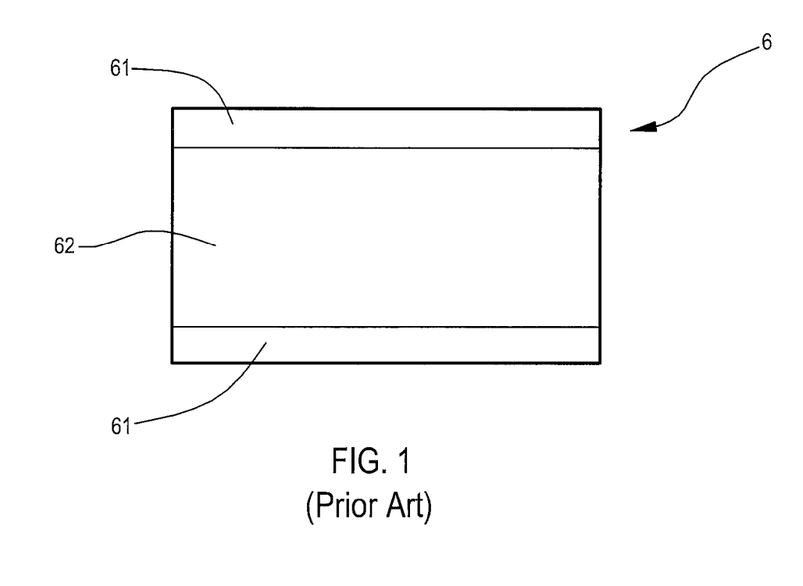
FIG. 1 is a side view illustrating a conventional resistive random access memory (RRAM) structure.
Figure 2:
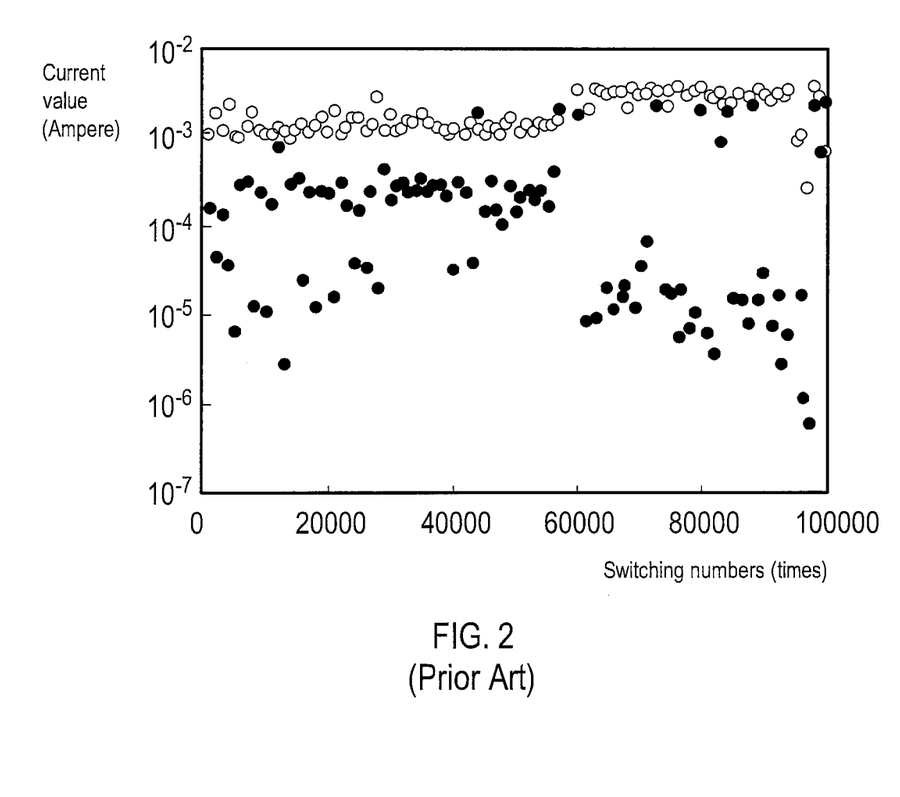
FIG. 2 is an endurance experimental data chart of a conventional RRAM illustrating a relationship between the resistance switching numbers and currents corresponding to the high impedance state and the low impedance state.

FIG. 1 is a conventional RRAM 6, which includes two electrode layers 61 spaced apart with each other and made of platinum (Pt) and titanium nitride (TiN), respectively, and a resistance switching layer 62 interposed between the two electrode layers 61 and made of nitroxide silicon oxynitrid (SiON). Then, an endurance experiment is performed on the conventional RRAM 6. That is, an alternate current is applied to the RRAM 6, such that the resistances of the RRAM 6 are continuously switched, and current values in the experiment are recorded and plotted during each switching as shown in FIG. 2. The formation or breaking of a conduction path is occurred in the resistance switching layer 62 during the switching between the high impedance state and the low impedance state; however, because each formation of the conduction path is not fixed, an irregular resistance transition may be occurred. That is, as shown in FIG. 2, the deviations of the solid dots are more obvious, which affects the stability of the RRAM 6.

SUMMARY

A resistive random access memory (RRAM) structure according to the disclosure comprises a first electrode layer, a resistance switching layer disposed on the first electrode layer, a diffusion metal layer disposed on the resistance switching layer, and a second electrode layer disposed on the diffusion metal layer, wherein at least one extension electrode is disposed in the resistance switching layer.

Moreover, the RRAM structure further includes a switching base part disposed on the first electrode layer, and a porous part disposed between the switching base part and the diffusion metal layer, wherein the porous part is made of a porous material, when an electric field is applied to the diffusion metal layer, the diffusion metal layer diffuses into the porous part so as to form one or more extension electrodes.

A controlling method for the resistive random access memory according to the disclosure comprises: applying a forming voltage between the first electrode layer and the second electrode layer, such that the diffusion metal in the diffusion metal layer is led by the forming voltage and diffuses into the resistance switching layer to form a plurality of extension electrodes; and applying an operation voltage between the first electrode layer and the second electrode layer such that the resistance switching layer is driven by the operation voltage to change a resistance value.

A manufacturing method of the resistive random access memory according to the disclosure comprises: providing a first electrode layer; forming a resistance switching layer on the first electrode layer; forming a diffusion metal layer on the resistance switching layer; forming a second electrode layer on the diffusion metal layer; and forming at least one extension electrode in the resistance switching layer.

The extension electrode forms a fixed conduction path in the resistance switching layer; therefore, a fixed and regular conduction path may be formed or broken while the resistance switching layer switches between the high impedance state and the low impedance state. In addition, metals have a better diffusion character for porous materials, such that the porous part may contribute the formation of the extension electrode.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Hereinafter, embodiments of the disclosure will be described in detail with reference to the accompanying drawings in such a manner that the technical idea of the disclosure may easily be carried out by a person with ordinary skill in the art to which the disclosure pertains. The disclosure may, however, be embodied in different forms and should not be construed as limited to the embodiments set forth herein.

Figure 3:
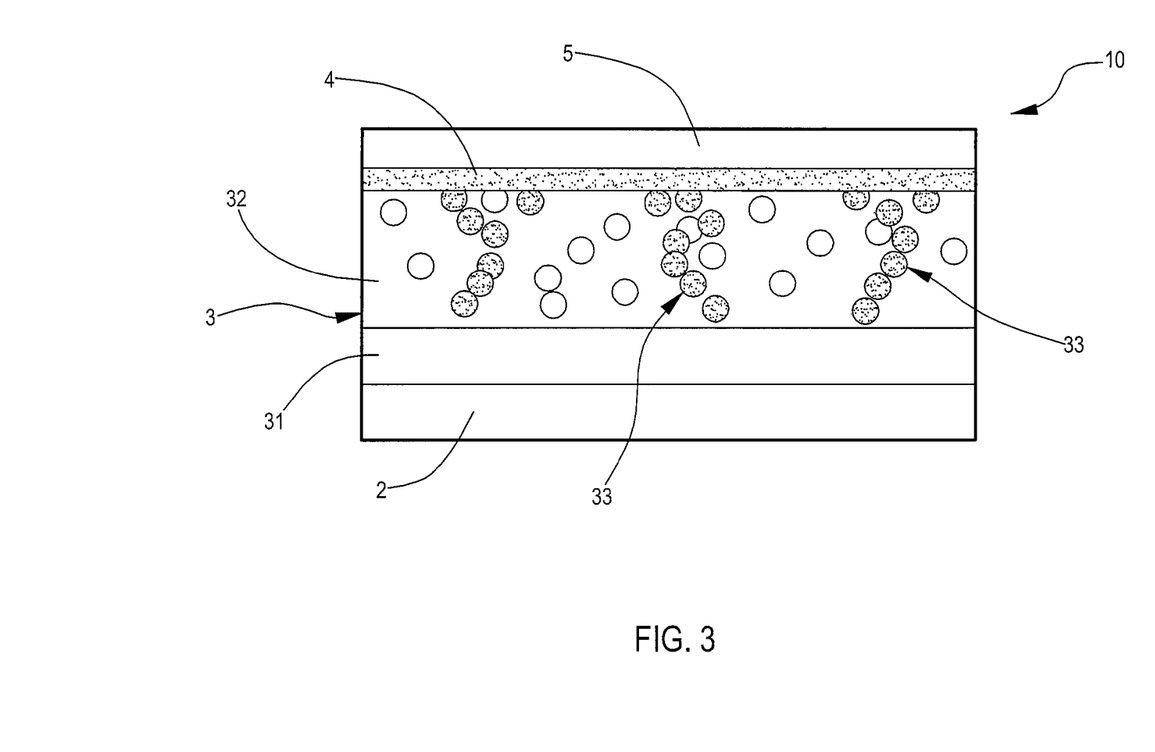
FIG. 3 is a side view of illustrating a RRAM structure according to a first embodiment of the disclosure.
Figure 5:
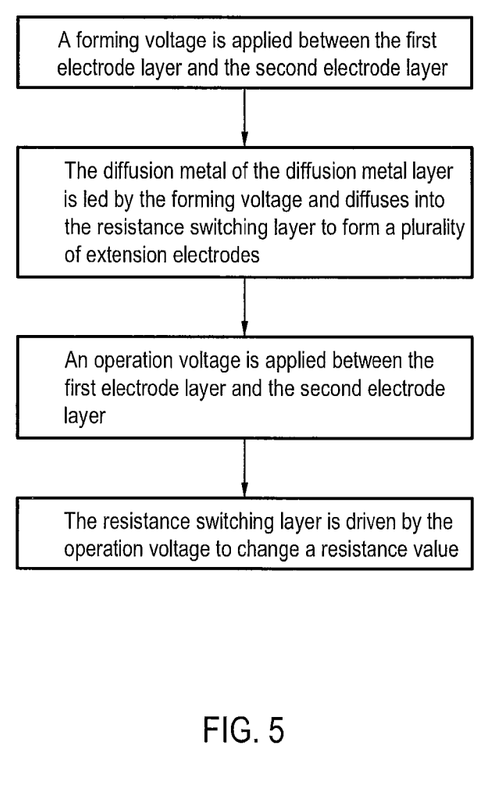
FIG. 5 is a flow chart illustrating a controlling method according to the first embodiment of the disclosure.
Figure 6:
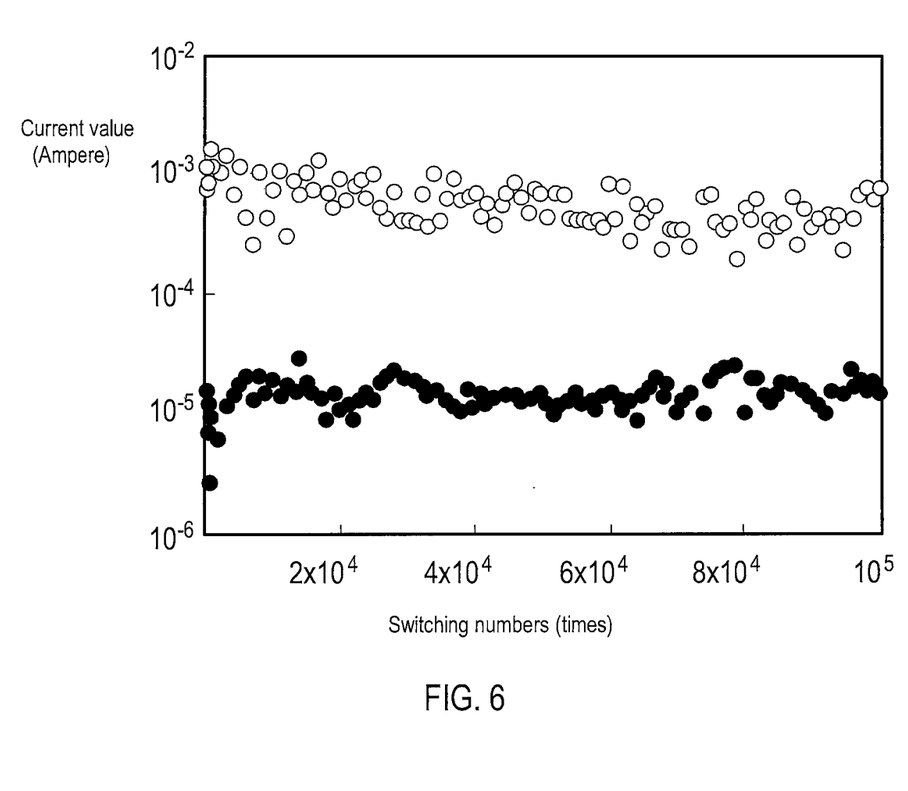
FIG. 6 is an endurance experimental data chart of a RRAM illustrating a relationship between the resistance switching numbers and currents corresponding to the high impedance state and the low impedance state according to the first embodiment of the disclosure.

Referring to FIGS. 3, 5 and 6, the resistive random access memory (RRAM) structure 10 according to a first embodiment of the disclosure comprises: a first electrode layer 2 made of a conductive material, a resistance switching layer 3 disposed on the first electrode layer 2, a diffusion metal layer 4 disposed on the resistance switching layer 3, and a second electrode layer 5 made of a conductive material and disposed on the diffusion metal layer 4.

The RRAM structure 10 is a sandwich layered structure, and the resistance switching layer 3 and the diffusion metal layer 4 are disposed between the first electrode layer 2 and the second electrode layer 5. In an embodiment, the first electrode layer 2 may be made of TiN, and the second electrode layer 5 may be made of Pt according to the first embodiment of the disclosure.

The resistance switching layer 3 may be driven by voltage or current, and may switch between the high impedance state and the low impedance state. In an embodiment, in the structure, the resistance switching layer 3 has a layer-type switching base part 31 on the first electrode layer 2, and a layer-type porous part 32 on the switching base part 31. In the embodiment of the disclosure, the switching base part 31 is made of SiON, and the porous part 32 is made of a porous material. Moreover, the porous part 32 may be any insulators which use a powder metallurgy method, a penetrating casting method, a spray deposition method, a foam molding method or an eutectic unidirectional solidification method to generate a porous state. In addition, the thickness of the switching base part 31 may be in a range between 2 nm and 10 nm, and the thickness of the porous part 32 may be in a range between 2 nm and 10 um.

The porous part 32 is disposed between the diffusion metal layer 4 and the switching base part 31, wherein the diffusion metal layer 4 may be made of a cooper (Cu) material with diffusion characters, which can be drawn by an electric field; therefore, the diffusion metal layer can diffuse into the porous part 32 to form one or more extension electrodes 33 in the porous part 32.

Figure 4:
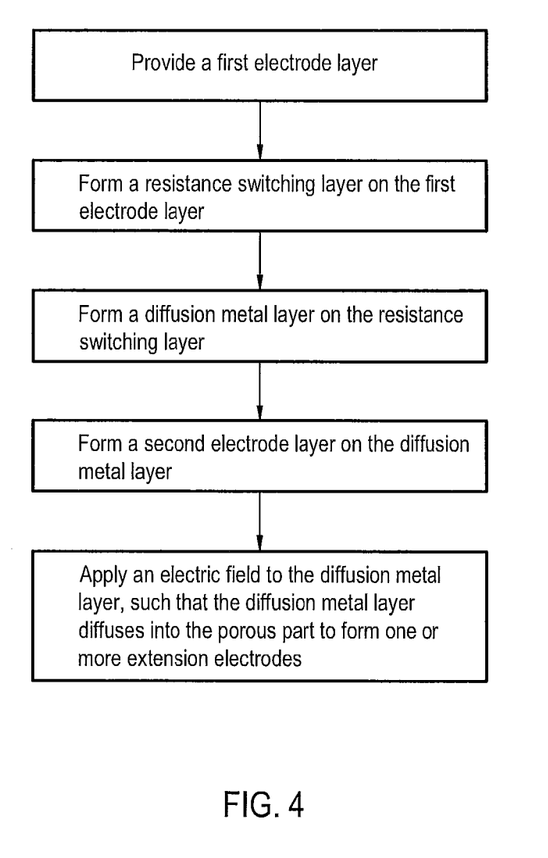
FIG. 4 is a flow chart illustrating a manufacturing method according the first embodiment of the disclosure.

The manufacturing method of the RRAM is illustrated in FIG. 4. Please refer to FIGS. 3, 5 and 6 together for better understanding. The method comprises: forming the switching base part 31 on the first electrode layer 2; forming the porous part 32 on the switching base part 31; forming the diffusion metal layer 4 on the porous part 32 of the resistance switching layer 3; and forming the second electrode layer 5 on the diffusion metal layer 4. After an electric field is applied to the diffusion metal layer 4, the diffusion metal layer 4 diffuses into the porous part 32 to form the extension electrodes 33 in the porous part 32.

Figure 7:
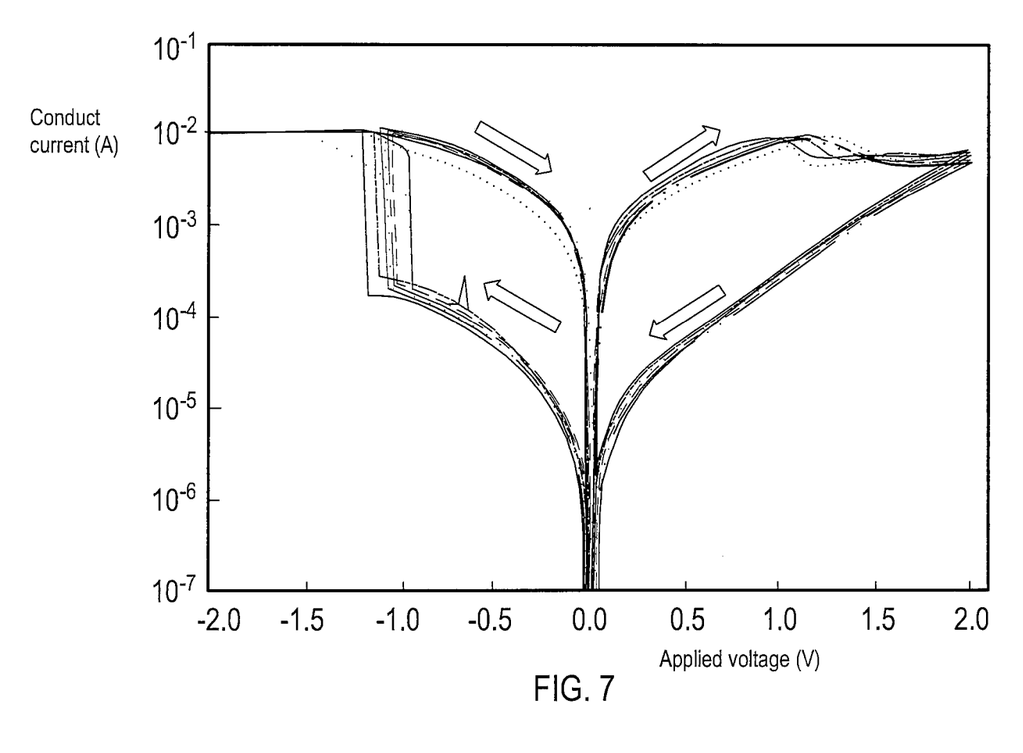
FIG. 7 is an operation character chart showing a relationship between the conduction currents and the applied voltages.

Please refer to FIGS. 3, 5 and 7, the control method of the RRAM comprises: applying a forming voltage between the first electrode layer 2 and the second electrode layer 5, such that the diffusion metal in the diffusion metal layer 4 is led by the forming voltage and diffuses into the porous part 32 to form the extension electrodes 33 in the porous part 32; applying an operation voltage between the first electrode layer 2 and the second electrode layer 5, such that the switching base part 31 is driven by the operation voltage to change resistance values. The differences of the resistance values are used for operating the stored data. In an embodiment, the operation voltage is a pulse voltage. When the operation voltage is beyond a predetermined range, that is, the resistance level of the switching base part 31 is changed so as to "data writing" or "data erasing". In the embodiment of the disclosure, the voltage for "data writing" is −1 voltage, and the voltage for "data erasing" is −1.3 voltage.

The extension electrodes 33 are formed by diffusion, and the concentration of the diffusion is gradually decreased as the diffusion path elongates. Therefore, the width of the extension electrode 33 is gradually reduced, such that the extension electrode 33 may look like a cone shape.

The extension electrode 33 forms a conduction path in the porous part 32; that is, most of electric currents pass through the extension electrodes 33 by the porous part 32 and then conduct to the switching base part 31; therefore, during the switching between the high impedance state and the low impedance state, a conduction path can be formed or broken. Moreover, the extension electrodes 33 may have a point effect due to the cone shape to concentrate the electric field so as to increase the efficiency of resistance transition.

Please refer to FIGS. 3 and 6, FIG. 6 is an endurance experiment for the RRAM structure 10 according to the embodiment of the disclosure. In the FIG. 6, it shows a result of continuously performing about $10^5$ of the resistance switching. The conduct current values form two groups clearly in the figure, and the current values are located on the predetermined range, respectively. The high impedance state and the low impedance state can be clearly and indeed switched, so as to have a better stability of switching characters.

Metals have better a diffusion character for porous materials, that is, the porous part 32 may contribute to form the extension electrode 33, such that the energy consumption and manufacturing time can be reduced in order to increase efficiencies. In addition, the porous size of porous part 32 may affect the end width of the extension electrode 33; that is, the tip portion of the extension electrode 33. If the porous size is small, the tip portion of the extension electrode 33 is narrow. In one embodiment, the size of porous is in a range between 1 $nm^2$ and 10 $nm^2$. In addition, if the porous density of the porous part 32 is too high, the porous part 32 may not be able to support the structure, causing the extension electrode 33 unable to have selectivity. However, if the porous density of the porous part 32 is too low, the power consumption for forming the extension electrode 33 become higher; therefore, the porous density of the porous part 32 is in a range between 1% and 10%.

On the other hand, the switching base part 31 is used to generate a resistance transition character, such that it may be another materials having resistance transition characters, such as semiconductor oxide, semiconductor nitride, semiconductor oxynitride, metal oxide, metal nitride, or metal oxynitride and so on, and is not limited to silicon oxynitride (SiON) of the embodiment of the disclosure.

The diffusion metal layer 4 is used for generating a diffusion effect to form the extension electrode 33 and conduct with the second electrode layer 5. Therefore, the diffusion metal layer 4 may be made of silver (Ag) or tin (Sn) with conductive and diffusion characters, but is not limited to the cooper (Cu) material of the embodiment of the disclosure.

Figure 8:
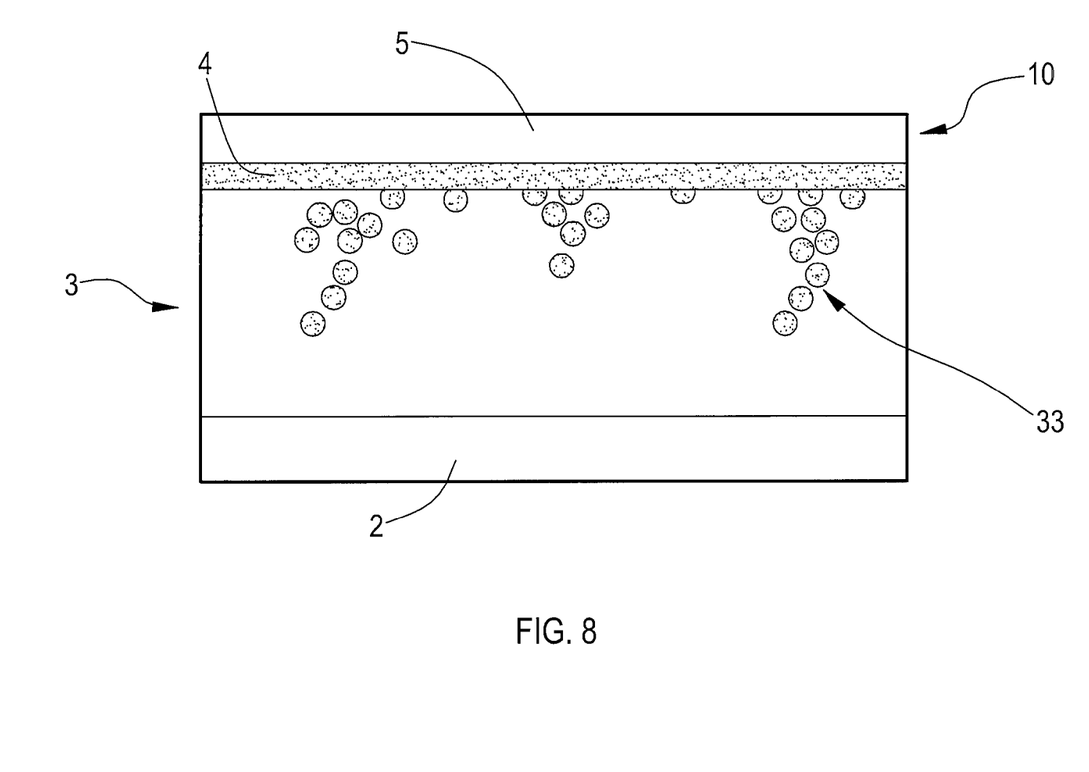
FIG. 8 is a side view of illustrating a RRAM structure according to a second embodiment of the disclosure.

Please refer to FIG. 8, the function and structure of the RRAM structure 10 according to a second embodiment are similar to that of the first embodiment, and they are all include a first electrode layer 2, a resistance switching layer 3 disposed on the first electrode layer 2, a diffusion metal layer 4 disposed on the resistance switching layer 3, and a second electrode layer 5 disposed on the diffusion metal layer 4.

The differences with the first embodiment lie in that: the resistance switching layer 3 according to the present embodiment is made of SiON; that is, the resistance switching layer 3 is a film formed from a single material, and the diffusion metal layer 4 diffuses into the resistance switching layer 3 to from the extension electrode 33.

Since the diffusion metal layer 4 may also diffuse into the SiON material, generate the extension electrode 33, and form or break a conduction path while switching the resistances switching, the extension electrode 33 may also form on the materials with resistance transition characters such as SiON, which may contribute the stability of resistance switching.

Although the disclosure is disclosed above with reference to the above embodiments, the embodiments are not intended to limit the disclosure. Equivalent replacements of variations and modifications made by any person skilled in the art without departing from the spirit and scope of the disclosure still fall with the protection scope of the disclosure.

What is claimed is:

1. A resistive random access memory (RRAM) structure, including:
    a first electrode layer;
    a resistance switching layer disposed on the first electrode layer, and at least one extension electrode is disposed in the resistance switching layer;
    a diffusion metal layer disposed on the resistance switching layer; and
    a second electrode layer disposed on the diffusion metal layer,
    wherein the resistance switching layer further includes a switching base part disposed on the first electrode layer, and a porous part disposed between the switching base part and the diffusion metal layer, the porous part being an insulator, and
    wherein the porous part is made of a porous material, and when an electric field is applied to the diffusion metal layer, the diffusion metal layer diffuses into the porous part to form one or more extension electrodes in the porous part.

2. The RRAM structure of claim 1, wherein a porous density of the porous part is in a range between 1% and 10%.

3. The RRAM structure of claim 1, wherein a porous size of the porous part is in a range between 1 nm$^2$ and 10 nm$^2$.

4. The RRAM structure of claim 1, wherein a width of the extension electrode is gradually decreased toward the switching base part.

5. The RRAM structure of claim 1, wherein a thickness of the switching base part is in a range between 2 nm and 10 nm.

6. The RRAM structure of claim 1, wherein a thickness of the porous part is in a range between 2 nm and 10 um.

7. The RRAM structure of claim 1, wherein the diffusion metal layer is made of one of copper (Cu), tin (Sn), and silver (Ag).

8. The RRAM structure of claim 1, wherein the switching base part is made of one of semiconductor oxide, semiconductor nitride, semiconductor oxynitride, metal oxide, metal nitride, and metal oxynitride.

9. A controlling method for a resistive random access memory including a first electrode layer, a resistive switching layer disposed on the first electrode layer, a diffusion metal layer disposed on the resistive switching layer, and a second electrode layer disposed on the diffusion metal layer, the control method comprising:
    applying a forming voltage between the first electrode layer and the second electrode layer, such that diffusion metal in the diffusion metal layer is led by the forming voltage and diffuses into the resistance switching layer to form a plurality of extension electrodes; and
    applying an operation voltage between the first electrode layer and the second electrode layer such that the resistance switching layer is driven by the operation voltage to change a resistance value,
    wherein when an electric field is applied to the diffusion metal layer, the diffusion metal layer diffuses into a porous part which in the resistance switching layer to form one or more extension electrodes in the porous part, and
    wherein the porous part is an insulator.

10. A manufacturing method of a resistive random access memory, comprising:
    providing a first electrode layer;
        forming a resistance switching layer on the first electrode layer;
        forming a diffusion metal layer on the resistance switching layer;
        forming a second electrode layer on the diffusion metal layer; and
        forming at least one extension electrode in the resistance switching layer,
        wherein the step of forming the resistance switching layer comprises:
            forming a switching base part on the first electrode layer; and
            forming a porous part on the switching base part, the porous part being an insulator, and
        wherein the porous part is made of a porous material, and in the step of forming the extension electrode, when an electric field is applied to the diffusion metal layer, the diffusion metal layer diffuses into the porous part to form one or more extension electrodes in the porous part.

11. The manufacturing method of claim 10, wherein a porous density of the porous part is in a range between 1% and 10%.

12. The manufacturing method of claim 10, wherein a porous size of the porous part is in a range between 1 nm$^2$ and 10 nm$^2$.

13. The manufacturing method of claim 10, wherein a thickness of the switching base part is in a range between 2 nm and 10 nm.

14. The manufacturing method of claim 10, wherein a thickness of the porous part is in a range between 2 nm and 10 um.

15. The manufacturing method of claim 10, wherein the diffusion layer is made of one of copper (Cu), tin (Sn), and silver (Ag).

16. The manufacturing method of claim 10, wherein the switching base part is made of semiconductor oxide, semiconductor nitride, semiconductor oxynitride, metal oxide, metal nitride, and metal oxynitride.

* * * * *